United States Patent [19]

Jensen

[11] 4,277,694

[45] Jul. 7, 1981

[54] CHARGE COUPLED DEVICE VARIABLE DIVIDER WITH INTEGRATING WELL

[75] Inventor: William E. Jensen, San Pedro, Calif.

[73] Assignee: Hughes Aircraft Company, Culver City, Calif.

[21] Appl. No.: 80,848

[22] Filed: Oct. 1, 1979

[51] Int. Cl.$^3$ .................... G11C 19/28; H01L 29/78
[52] U.S. Cl. .................. 307/221 D; 357/24; 340/347 AD
[58] Field of Search ...................... 357/24; 307/221 D

[56] References Cited

U.S. PATENT DOCUMENTS

| | | | |
|---|---|---|---|
| 4,027,260 | 5/1977 | Carnes et al. | 357/24 |
| 4,092,549 | 5/1978 | Prince | 307/221 D |

*Primary Examiner*—Gene M. Munson
*Attorney, Agent, or Firm*—Robert M. Wallace; William H. MacAllister

[57] ABSTRACT

A charge injection means periodically introduces a charge packet into a charge flow channel in a semiconductive substrate surface under the control of a clock signal. The charge packets are accumulated beneath an integrating electrode in the charge flow channel until the amount of charge stored beneath the integrating electrode reaches a predetermined amount. Upon this occurrence, the charge subsequently injected spills over a potential barrier and into charge sensing means near the integrating electrode. The charge sensing means responds to the spilled charge by causing substantially the entire accumulated charge to be spilled over the barrier into the charge sensing means in a regenerative feedback loop. Operation of the regenerative feedback loop accelerates a change in potential of the integrating electrode, causing an electrical output pulse to be generated at the integrating electrode. The dividing ratio of the device is the ratio between the pulse rate of the output pulses on the integrating electrode and the pulse rate of the clock signal applied to the charge injection means, and this ratio may be altered merely by changing the size of each charge packet injected by the charge injection means.

10 Claims, 6 Drawing Figures

CHARGE COUPLED DEVICE VARIABLE DIVIDER WITH INTEGRATING WELL

TECHNICAL FIELD

The present invention is related to charge coupled devices (CCDs) and to frequency dividers and analog dividing multipliers having a variable dividing ratio.

RELATED APPLICATIONS

This application contains subject matter which is related to matter disclosed in the U.S. Patent application Ser. No. 083,421, filed Oct. 10, 1979, the applicant of the present application and assigned to the assignee of the present application, and entitled "Charge Coupled Device Feedback Analog to Digital Converter".

BACKGROUND ART

Currently available analog dividing circuits and frequency dividers typically include a plurality of logic circuits requiring numerous transistors in integrated circuits having relatively large geometry and relatively high power consumption. One disadvantage of such prior art dividers is that the hardware must usually be altered in order to change the dividing ratio.

SUMMARY OF THE INVENTION

The foregoing problems are solved in the present invention, a charge coupled device, which performs division with a variable dividing ratio. The charge coupled structure of the invention facilitates the use of extremely small geometry and the minimization of power consumption to a very low level. The dividing ratio in the present invention may be changed without altering any of the hardware, merely by varying a control voltage supplied to the charge coupled device.

The divider of the present invention is formed on a semiconductor substrate having upper and lower insulated layers of electrodes controlling charge transfer on the substrate surface. A charge injection means periodically introduces a charge packet into a charge flow channel in the substrate surface under the control of a clock signal. The charge packets are accumulated beneath an integrating electrode in the charge flow channel until the amount of charge stored beneath the integrating electrode reaches a predetermined amount. Upon this occurrence, the charge subsequently injected spills over a potential barrier and into charge sensing means near the integrating electrode. The charge sensing means responds to the spilled charge by causing substantially the entire accumulated charge to be spilled over the barrier into the charge sensing means in a regenerative feedback loop. Operation of the regenerative feedback loop accelerates a change in potential of the integrating electrode, causing an electrical output pulse to be generated at the integrating electrode. The dividing ratio of the device is the ratio between the pulse rate of the output pulses on the integrating electrode and the pulse rate of the clock signal applied to the charge injection means, and this ratio may be altered merely by changing the size of each charge packet injected by the charge injection means. Preferably, this is accomplished by varying the voltage applied to a barrier electrode in the charge injection means.

In an alternative embodiment, the charge coupled device divider of this invention may be integrated in a semiconductive substrate with other charge coupled devices generating a charge packet output which may be substituted for the above-described charge injection means. Thus, the analog divider of the present invention is easily integrated with other charge coupled devices without requiring additional hardware to provide compatibility, as would be required with typical prior art analog dividers or frequency dividing circuits.

In the preferred embodiment of the invention, a charge coupled device divider is designed with extremely small geometry to minimize size and power consumption to provide a significant improvement over the prior art.

BRIEF DESCRIPTION OF THE DRAWINGS

The invention is best understood by reference to the accompanying drawings of which.

DETAILED DESCRIPTION OF THE INVENTION

Figure 1:
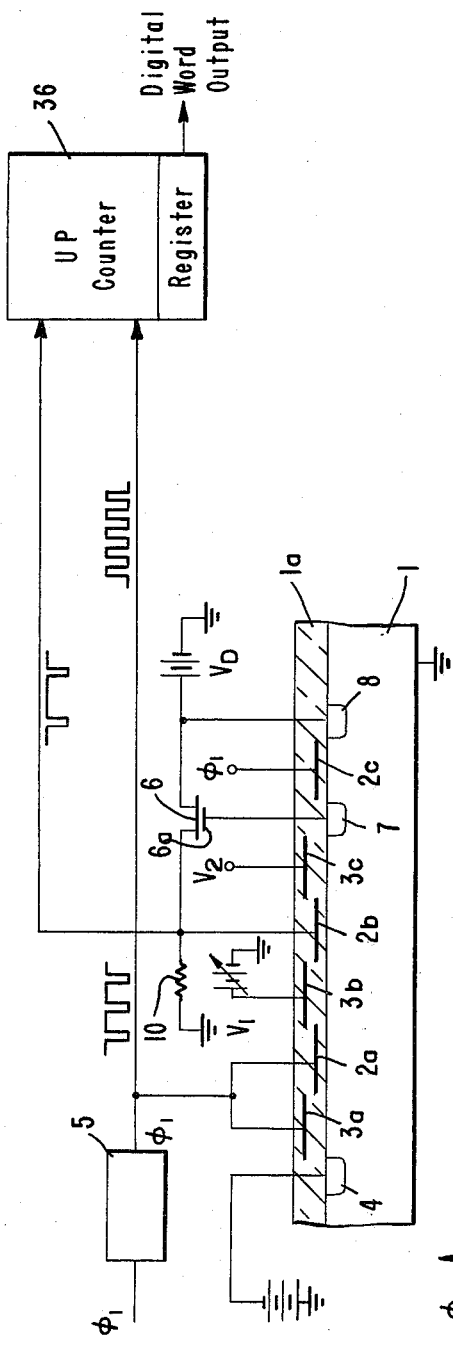
FIG. 1 is a schematic diagram of the preferred embodiment of the present invention.

Referring to FIG. 1, the charge coupled device divider of the present invention is an n-channel device formed on a semiconductive substrate 1 of p-type conductivity having upper and lower pluralities of electrodes 2 and 3 respectively embedded in an insulating oxide layer 1a overlying the surface of the substrate 1. A charge injection diode diffusion 4 of n-type conductivity is disposed at one end of the substrate 1 and is forward biased by connection to a source-voltage supply $V_s$. Lower and upper electrodes 2a and 3a immediately adjacent the input diffusion 4 are connected together to receive a periodic clock signal, $\phi_1$, from a clock pulse generator 5. Upper level electrode 3b adjacent lower level electrode 2a is connected to a constant barrier voltage source $V_1$, while the next adjacent upper level electrode 3c is connected to another barrier voltage source $V_2$. A lower level electrode 2b between the upper level electrodes 3b and 3c is connected to the source of a source follower transistor 6 biased by a drain voltage source $V_d$. The transistor 6 is an n-channel metal oxide semiconductor field effect transistor (MOSFET) of the type well known in the art in which current between the drain voltage source $V_d$ and the integrating electrode 2b is controlled by the gate 6a of the transistor 6. A floating charge sensing diffusion 7 of n-type conductivity is disposed between the electrodes 3c and 2c and is connected to the MOSFET gate 6a. The floating diffusion 7 is of the type well known in the art and assumes a voltage potential which is proportional to the amount of charge stored thereunder. It should be recognized that any conductive means such as a floating electrode in the oxide layer 1a could be used in place of the diffusion 7. A drain diffusion 8, spaced from the sensing diffusion 7 by a clocked reset electrode 2c, is biased by the drain voltage supply $V_d$.

Charge packets injected from the input diffusion 4 under the control of clocked electrodes 3a and 2a are accumulated under the integrating electrode 2b, until the accumulated charge beneath the integrating electrode 2b exceeds a predetermined amount and spills over a potential barrier created beneath the barrier electrode 3c to be sensed by the charge sensing floating diffusion 7. After the charge spills over the barrier beneath the barrier electrode 3c, it is swept into a drain diffusion 8 by periodic application of a positive voltage $\phi_1$ to the reset electrode 2c disposed between the diffusions 7 and 8. This periodic application of $\phi_1$ to the reset electrode 2c also sets the potential of the diffusion 7 and of the gate of the transistor 6 to the voltage $V_0$ of the reset diffusion 8, thus setting the surface potential beneath the integrating electrode 2b to an initial level 25a, by virtue of the connection of the integrating electrode 2b to the source of the transistor 6. A regenerative feedback loop is activated whenever the charge sensing floating diffusion 7 senses charge, decreasing the source-to-drain conductance of the transistor 6, which decreases the amount of positive voltage applied to the integrating electrode 2b via the transistor 6. The resulting decrease in positive potential on the integrating electrode 2b forces more accumulated charge to spill out from under the integrating electrode 2b, further increasing the amount of charge sensed by the charge sensing diffusion 7, causing an additional decrease in the amount of negative voltage applied to the gate 6a of the transistor 6. The source-to-drain conductance of the transistor 6 decreases as soon as charge is sensed beneath the sensing diffusion 7 until all the charge previously accumulated beneath the integrating electrode 2b has spilled over the potential barrier beneath the barrier electrode 3c into the sensing diffusion 7, at which time the source-to-drain conductance of transistor 6 is minimized so that the integrating electrode 2b is connected exclusively to the substrate 1 through a resistor 10.

Figure 2:
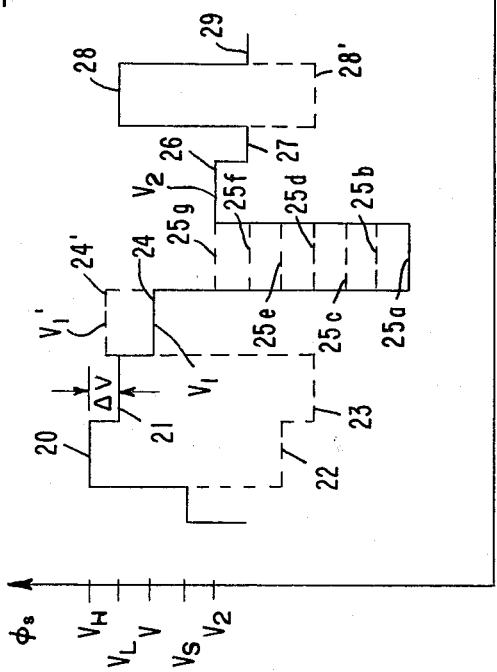
FIG. 2 is a simplified diagram of the electrical surface potential corresponding to the schematic diagram of FIG. 1.

Each of the pluralities of electrodes 2 and 3 create an electrical surface potential $\Phi_s$ in the surface of the substrate 1 which is illustrated in FIG. 2. Thus application of the clock signal $\phi_1$ from the clock pulse generator 5 to the charge injection electrodes 2a and 3a causes the surface potential beneath these electrodes to switch from the solid line potential barrier 20 and 21 to the dotted line potential well 22 and 23 at a frequency equal to the frequency $F_c$ of the clock signal $\phi_1$. FIG. 2 shows that there is a potential difference, $\Delta V$, between the surface potential underlying the upper level input electrode 3a and the surface potential underlying the lower level injection electrode 2a, which is preferably obtained by implanting a barrier implant of dopant impurities beneath the upper level electrodes 3 in a manner well known in the art. The surface potential in the input diffusion 4 is equal to $V_s$, the source voltage, which causes the input diode 4 to be forward biased whenever the surface potential beneath the injection electrodes 3a and 2a falls to the dotted line position illustrated in FIG. 2, causing the potential well 22, 23 to be filled with charge from the input diode 4. The barrier electrode 3b is connected to the voltage source $V_1$ to provide a potential barrier 24 over which the charge stored in the potential well 22, 23 spills when the surface potential beneath the injection electrodes 2a, 3a returns to the solid line position to form the barrier 20, 21. An integration well 25 in the surface potential $\Phi_s$ is created whenever the clock signal $\phi_1$ applied to the reset electrode 2c causes the surface potential beneath the integrating electrode 2b to be set to the initial (bottom) level 25a, as mentioned previously. The first charge packet to spill over the barrier 24 into the integration well 25 raises the surface potential of the well 25 from its bottom level 25a to the next potential level 25b. In the situation illustrated in FIG. 2, after six injected charge packets have spilled over the barrier 24 into the integration well 25, the surface potential beneath the integration electrode 2b is at its maximum potential level 25g so that the next charge packet spills over a second barrier 26 beneath barrier electrode 3c. The height of the barrier 26 is determined by the magnitude of the voltage $V_2$ applied to the barrier electrode 3c. Charge spilling over the barrier 26 enters the floating diffusion 7, which is initially at a potential $V_d$ to create an initial potential well 27 in the surface potential $\Phi_s$ in the floating diffusion 7. As described previously, the charge sent into the potential well 27 and sensed by the floating diffusion 7 creates a less positive potential on the gate 6a of the MOSFET 6, decreasing the amount of positive voltage applied to the integrating electrode 2b, thus forcing more charge to be spilled over the barrier 26 into the potential well 27. The regenerative feedback thus created further decreases the source-to-drain conductivity of the transistor 6 by application of an ever-decreasing positive voltage to the gate 6a until all of the charge in the potential well 25 is emptied into the potential well 27.

Charge is removed from the potential well 27 beneath the sensing diffusion 7 by application of a complementary clock signal $\overline{\phi_1}$ to the reset electrode 2c, which causes the surface potential beneath the reset electrode 2c to fall from its solid line position to the dotted line position to form a channel 28', which forces charge to transfer from the potential well 27 into a potential level 29 in the reverse biased drain diffusion 8, thus clearing charge from the integrating well 25 and from the charge sensing well 27 for the next operation of the above described integrating and regenerative loop cycle.

Figure 3:
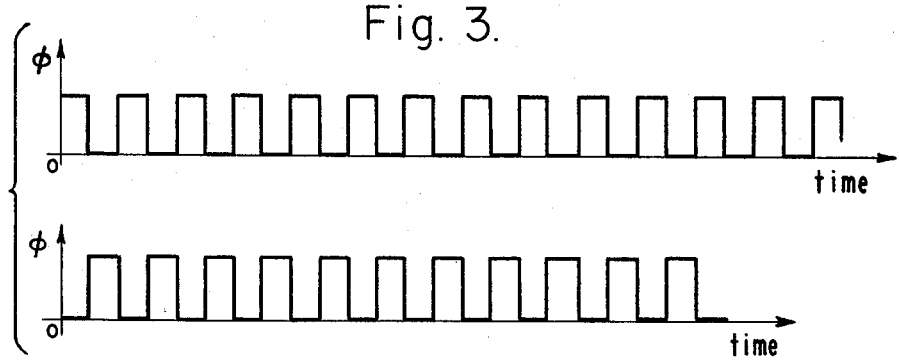
FIG. 3 includes diagrams of time domain waveforms of the clock signal $\phi_1$ and $\bar{\phi}_1$ applied to the charge coupled device of FIG. 1.
Figure 4:
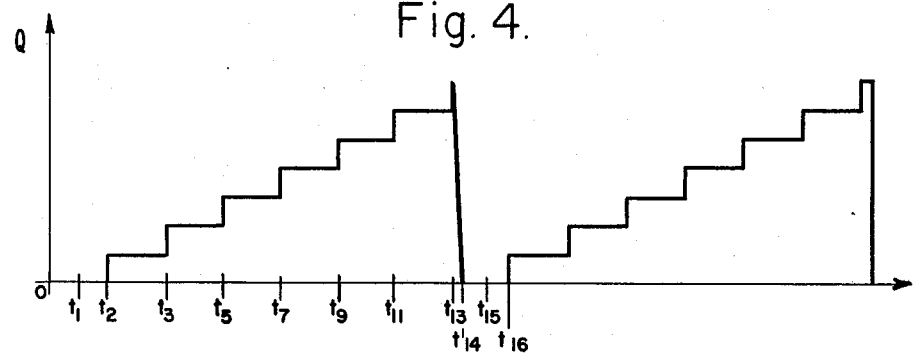
FIG. 4 illustrates the accumulation of charge packets beneath the integrating electrode in the charge coupled device of FIG. 1 as a function of time.
Figure 5:
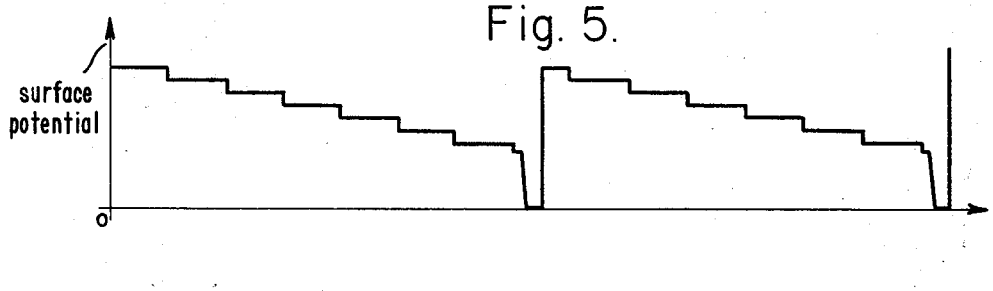
FIG. 5 is a diagram of the time domain waveform of the surface potential beneath the integrating electrode of the charge coupled device of FIG. 1.

Operation of the CCD divider of FIG. 1 will now be described in detail by simultaneous reference to FIGS. 1 through 7. Referring to FIG. 3a, at time $t_0$ the clock signal $\phi_1$ is at zero voltage, which creates a potential barrier 20, 21 in the surface potential $\Phi_s$ illustrated in FIG. 2 beneath the electrodes 2a and 3a of FIG. 1. At time $t_1$ the clock signal $\phi_1$ is at a positive voltage, creating a potential well 22, 23 in the surface potential $\Phi_s$ beneath the electrodes 2a and 3a so that the charge injection diode diffusion 4 is forward biased, causing charge to flow from the diode 4 and fill the potential well 22, 23. At time $t_2$ the clock signal $\phi_1$ returns to zero voltage so that the surface potential $\Phi_s$ beneath the electrodes 2a and 3a returns to the solid line position 20, 21 illustrated in FIG. 2. As a result, a charge packet containing an amount of charge proportional to the voltage difference $\Delta V$ between the potential barrier 20 and the potential barrier 21, spills over the potential barrier 24 underlying the barrier electrode 3b into the integrating well 25 beneath the integrating electrode 2b. The first charge packet to be spilled over the barrier 24 into the integrating well 25 alters the surface potential directly beneath the integrating electrode 2b so that the level of the potential well 25 rises from the lowest level 25a to the next level 25b. At time $t_3$ a second charge packet spills into the integrating well 25 in the same manner as the first charge packet, causing the surface potential directly beneath the integrating electrode 2b to again change so that the level of the potential well 25 rises from the second level 25b to a third level 25c. Similarly, at times $t_5$, $t_7$, $t_9$ and $t_{11}$ a third, fourth, fifth, and sixth charge packet respectively spills into the well 25 causing the well level to further rise until it is at level 25g, at which point the well 25 is full. Thus, at time $t_{13}$, when a seventh charge packet is injected from the diode diffusion 4 to spill over the barrier 24, charge can no longer enter the well 25, so that the seventh charge packet spills over the barrier 26 into the potential well 27 to be sensed by the charge sensing floating diffusion 7. Referring to FIG. 4, it is seen that the amount of charge $Q_1$ stored beneath the integrating electrode 2b increases in seven steps from time $t_1$ to time $t_{13}$, causing a corresponding, relatively small, drop in the surface potential directly underlying the integrating electrode 2b as illustrated in FIG. 5.

Figure 6:
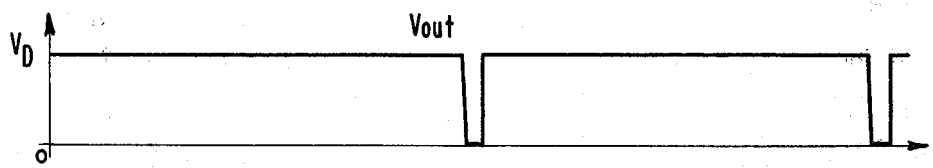
FIG. 6 is a diagram of the time domain waveform of the voltage induced on the integrating electrode of the charge coupled device of FIG. 1.

The charge sensed by the charge sensing floating diffusion 7 at time $t_{13}$ causes the voltage on the gate 6a of the transistor 6 to become less positive. Therefore, at time $t_{13}$ the source-to-drain conductivity of the transistor 6 begins to decrease, which reduces the source voltage applied by the transistor 6 to the integrating electrode 2b. Consequently, the surface potential directly underlying the integrating electrode 2b begins to drop at time $t_{13}$, as illustrated in FIG. 5, forcing the charge accumulated beneath the integrating electrode 2b to begin to spill over the adjacent barrier 26 into the potential well 27 in the charge sensing diffusion 7. As a result, the source-to-drain conductivity of the transistor 6 drops more rapidly, causing charge to spill into the sensing diffusion 7 at an ever-increasing rate. The regenerative feedback loop thus activated minimizes the conductivity of the transistor 6 at time $t_{14}$, creating a negative-going pulse 30 in the output voltage $V_{out}$ on the integrating electrode 2b as illustrated in FIG. 6. The rise time of the pulse 30 is determined by the rate at which charge spills over the potential barrier 26 from the integrating well 25. The output voltage $V_{out}$ on the integrating electrode 2b is utilized by an up-counter 36 which accumulates counts in synchronism with the clock signal $\phi_1$ in a manner well known in the art. Comparing FIGS. 3a and 6, it is apparent that the counting circuit of this invention will count one pulse 30 from the output voltage $V_{out}$ on the integrating electrode 2b for every seven pulses of the clock signal $\phi_1$. Therefore the counter 36 will accumulate a count to form a digital word which corresponds to the dividing ratio, which in this example is seven.

At time $t_{15}$ the clock signal, $\phi_1$ is positive and is applied to the reset electrode 2c, causing the charge which spilled into the potential well 27 in the floating diffusion 7 to be attracted beneath the reset electrode 2c to the drain diffusion 8. Simultaneously, the charge sensing diffusion 7 no longer senses any charge so that the voltage applied to the gate 6a of the transistor 6 returns to the potential level $V_0$, returning the transistor 6 to its original state and causing the surface potential underlying the integrating electrode 2b to return to its original level 25a. Thus, the entire system is returned to its original state and is ready to count seven more charge packets before generating another output pulse to be fed to the up-counter 36. At time $t_{16}$ the clock signal $\phi_1$ is again at a zero voltage and the entire cycle repeats itself as illustrated in FIGS. 2 through 7.

While the above-described operation generated a pulse train having a frequency one-seventh the frequency of the clock signal $\phi_1$, corresponding to a division ratio n equal to seven, the division ratio n may be any selected integer. Selection of the division ratio n may be accomplished, for example, by varying the voltage of the drain voltage supply $V_d$, which will cause the initial depth 25a of the potential well 25 to change. Alternatively, the voltage $V_1$ applied to the barrier electrode 3b may be varied to assume a value $V_1'$ to create the dashed line potential 24' illustrated in FIG. 2. Selectable variation of the division ratio n is thus obtained by varying $V_1'$ between the voltage $V_L$ of the potential barrier 21 and the voltage $V_H$ of the potential barrier 20, as indicated in dashed lines in FIG. 2. As discussed previously, the initial bottom position 25a is determined by the source voltage of the transistor 6 which is applied to the integration electrode 2b. Also, the height of the barrier 26 is determined by the voltage $V_2$ applied to the barrier electrode 3c. Assuming uniform depletion and electrode capacitance throughout the substrate 1, it is easily shown that the division ratio n is equal to $(V_2-V_d)/(V_1'-V_H)$ if $V_1$ is less than $V_H$ and greater than $V_L$. Thus, by the simple expedient of varying the voltage $V_1$ applied to the barrier electrode 3b or by varying the voltage of the drain voltage supply $V_d$, or by varying the voltage $V_2$ applied to the electrode 3c, the division ratio n is easily selected without requiring any change in the structure of the charge coupled device divider of the present invention. Furthermore, by varying both $V_1$ and either $V_2$ or $V_d$, a sophisticated divider or dividing multiplier may be provided as a charge coupled device of minimum geometry and highly reduced power consumption. While the preferred embodiment illustrated in FIG. 1 has been described as being an n-channel charge coupled device, it should be apparent to those skilled in the art that a p-channel charge coupled device would suffice as well. Furthermore, it is within the scope of this invention to use any big processor or hardware in place of the up-counter 36 to process the output signal $V_{out}$ from the device of FIG. 1. It is contemplated that the invention illustrated in FIG. 1 may be used as a frequency divider in which the dividing ratio n may be selected to be any integer.

The invention may be used as a frequency dividing component in an integrated circuit, in which the up-counter 36 and register are unnecessary, and the output voltage $V_{out}$ would be applied to some other component of the integrated circuit.

Finally, it is also contemplated that the invention may be used as an analog-to-digital converter in conjunction with the up-counter 36 and the register, in which a sampled analog signal applied to the electrode 3b as a voltage $V_1$, or applied to the electrode 3c as a voltage $V_2$ or applied to the diffusion 8 as a voltage $V_d$, is converted into a digital count accumulated by the counter 36 and stored in the register in the manner previously described.

What is claimed is:

1. A charge coupled device variable ratio divider formed on a semiconductive substrate and controlled by a clock signal means utilizing regenerative charge coupled feedback, comprising:

charge injection means for sequentially injecting charge packets of a preselected size into said charge coupled device in synchronism with said clock signal means;
means for varying said preselected size;

charge integration electrode means for accumulating a limited predetermined number of said injected charge packets in the surface of said substrate;

floating conductor means for sensing overflow of charge from said integration means upon accumulation of said predetermined number;

charge coupled regenerative feedback means for forcing said charge packets accumulated by said integration means to overflow from said integration means in response to said floating conductor means for sensing overflow; and means responsive to said charge coupled regenerative feedback means for generating a frequency divided clock signal having a frequency divided down from the frequency of said clock signal means by a ratio determined by said preselected size varying means.

2. The device of claim 1 wherein said regenerative feedback means comprises:

a voltage source having a polarity attractive to said injected charge packets;

a transistor having a source, drain and gate for conducting charge between said source and drain of the same polarity as said injected charge packets;

means for connecting said integration electrode means to said voltage source through said source and drain; and means connecting said gate to said sensing means for increasing resistance between said source and drain in response to charge overflow from said integration means.

3. The device of claim 1 wherein said preselected size controlling means comprises a division ratio selection means for changing said preselected size of said injected charge packets in response to a selected voltage including an electrode overlying said substrate connected to receive said voltage and located adjacent said charge injection means.

4. The device of claim 1 wherein said charge injection means comprises:

an input diode diffusion connected to a forward bias voltage source, and disposed in the surface of said substrate;

charge control electrodes overlying said substrate adjacent said input diode diffusion and connected to said clock signal means; and charge barrier electrode means between said charge control electrode means and said charge integration electrode means for determining the size of charge packets injected beneath said integration electrode means.

5. The device of claim 4 further comprising means for varying said determined number.

6. The device of claim 5 wherein said varying means comprises:

a voltage supply connected to said barrier electrode means; and means for varying the voltage of said supply.

7. The device of claim 5 wherein said varying means comprises means for varying said preselected size.

8. The device of claim 1 wherein said integration electrode means creates an electrical surface potential well in said substrate, said device further comprising means for varying the initial depth of said well.

9. The device of claim 1 wherein said substrate is a p-type conductivity, and said charge packets are of negative polarity.

10. In a charge coupled device including charge injection means for injecting charge packets of a preselected size n and means for varying said preselected size, integration means for accumulating a predetermined amount of charge N from said injecting means, means for sensing overflow from said integration means upon accumulation of said predetermined amount of charge N and regenerative feedback means for ejecting charge from said integration means in response to said overflow sensing means, a method for generating an output clock signal in response to an external clock signal, said output clock signal having a frequency equal to 1/R times the frequency of said external clock signal, comprising:

operating said injection means in synchronism with said external clock signal;

setting said preselected size varying means so that the ratio N/n is equal to R; and generating said output clock signal in synchronism with said regenerative feedback means.

* * * * *